United States Patent
Hudson et al.

(10) Patent No.: US 6,200,901 B1
(45) Date of Patent: Mar. 13, 2001

(54) POLISHING POLYMER SURFACES ON NON-POROUS CMP PADS

(75) Inventors: Guy F. Hudson; Michael A. Walker, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/095,299

(22) Filed: Jun. 10, 1998

(51) Int. Cl.[7] .................................................. C09K 13/00
(52) U.S. Cl. ........................ 438/697; 438/633; 438/692; 438/693
(58) Field of Search .................... 438/633, 692, 438/693, 697

(56) References Cited

U.S. PATENT DOCUMENTS

| | | |
|---|---|---|
| 4,702,792 * 10/1987 | Chow | 156/628 |
| 5,081,796   1/1992 | Schultz . | |
| 5,162,248 11/1992 | Dennison et al. . | |
| 5,232,875   8/1993 | Tuttle et al. . | |
| 5,262,354 * 11/1993 | Cote | 437/195 |
| 5,270,241 12/1993 | Dennison et al. . | |
| 5,297,364   3/1994 | Tuttle . | |
| 5,421,769   6/1995 | Schultz et al. . | |
| 5,486,129   1/1996 | Sandhu et al. . | |
| 5,494,857   2/1996 | Cooperman et al. . | |
| 5,514,245   5/1996 | Doan et al. . | |
| 5,533,923   7/1996 | Shamouilian et al. . | |
| 5,533,924   7/1996 | Stroupe et al. . | |
| 5,573,633 11/1996 | Gambino et al. . | |
| 5,575,706 11/1996 | Tsai et al. . | |
| 5,580,821 * 12/1996 | Mathews | 437/187 |
| 5,618,381 *  4/1997 | Doan | 438/633 |
| 5,645,469   7/1997 | Burke et al. . | |
| 5,718,618 *  2/1998 | Guckel | 451/41 |
| 5,866,031 *  2/1999 | Carpio | 252/79.1 |
| 5,897,375 *  4/1999 | Watts | 438/693 |
| 5,933,748 *  8/1999 | Chou | 438/431 |
| 5,934,978 *  8/1999 | Burke | 451/36 |
| 5,976,979 * 11/1999 | Chen | 438/691 |
| 5,981,378 * 11/1999 | Bothra | 438/637 |
| 6,020,265 *  2/2000 | Lou | 438/692 |
| 6,043,155 *  3/2000 | Homma | 438/691 |

* cited by examiner

*Primary Examiner*—Charles Bowers
*Assistant Examiner*—Lisa Kiloay
(74) *Attorney, Agent, or Firm*—Trask Britt

(57) ABSTRACT

Methods of oxidizing the surface of a photoresist material on a semiconductor substrate to alter the photoresist material surface to be substantially hydrophillic. Oxidation of the photoresist material surface substantially reduces or eliminates stiction between a planarizing pad and the photoresist material surface during chemical mechanical planarization. This oxidation of the photoresist material may be achieved by oxygen plasma etching or ashing, by immersing the semiconductor substrate in a bath containing an oxidizing agent, or by the addition of an oxidizing agent to the chemical slurry used during planarization of the resist material.

42 Claims, 11 Drawing Sheets

POLISHING POLYMER SURFACES ON NON-POROUS CMP PADS

BACKGROUND OF THE INVENTION

1. Field of the Invention

The present invention relates to chemical mechanical planarization in the production of semiconductor devices. More particularly, the present invention relates a novel method of aiding planarization by wetting surfaces of device materials to be planarized.

2. State of the Art

In the fabrication of integrated circuits, it is often necessary to planarize layered materials which are placed on a semiconductor substrate during the formation of the intergrated circuits. This planarization is used to remove topography, surface defects, scratches, roughness, or embedded particles in the material layers. One of the most widely utilized planarization processes is chemical mechanical planarization (hereinafter "CMP"). The CMP process involves holding and rotating the semiconductor substrate while bringing the material layer on the semiconductor substrate to be planarized against a wetted planarizing surface under controlled chemical, pressure, and temperature conditions. FIGS. 6 and 7 show an exemplary CMP apparatus 200 having a rotatable planarizing platen 202 and a planarizing pad 204 mounted to the planarizing platen 202. A rotatable substrate carrier 206 is adapted so that a force, usually between about 0.5 and 9.0 pounds per square inch, indicated by arrow 208 is exerted on a material layer (not shown) on a semiconductor substrate 210 (shown in FIG. 7). The semiconductor substrate 210 can be held in place on the rotatable substrate carrier 206 by well-known techniques including mechanical affixation, vacuum affixation, friction affixation, and the like.

The rotatable substrate carrier 206 is rotated in direction 212 by a carrier rotation mechanism 214, such as a motor or the like, at between about 0 and 100 revolutions per minute. The planarizing platen 202 and planarizing pad 204 are rotated in direction 216 by a platen rotating mechanism 218, such as a motor or the like, at between about 10 and 100 revolutions per minute. If the planarizing platen 202 and planarizing pad 204 are rotated at the same velocity as the rotational velocity of the rotatable substrate carrier 206, the average velocity is the same at every point on the semiconductor substrate 210.

A chemical slurry 220 (shown in FIG. 6) is supplied through a conduit 222 which dispenses the chemical slurry 220 onto the planarizing pad 204. The chemical slurry 220 contains a planarizing agent, such as alumina, silica, or fumed silica carried in an ammonium hydroxide solution or the like, which is used as the abrasive material for planarization. Additionally, the chemical slurry 220 may contain selected chemicals which etch various surfaces of the material layer of the semiconductor substrate 210 during the planarization.

One example of a semiconductor device, fabrication of which requires planarization steps, is a DRAM (Dynamic Random Access Memory) chip. A widely-utilized DRAM chip manufacturing process utilizes CMOS (Complementary Metal Oxide Semiconductor) technology to produce DRAM circuits which comprise an array of unit memory cells, each including one capacitor and one transistor, such as a field effect transistor ("FET"). In the most common circuit designs, one side of the transistor is connected to external circuit lines called the bit line and the word line, and the other side of the capacitor is connected to a reference voltage that is typically one-half the internal circuit voltage. In such memory cells, an electrical signal charge is stored in a storage node of the capacitor connected to the transistor which charges and discharges circuit lines of the capacitor.

FIGS. 8–18 illustrate an exemplary method of fabricating a capacitor for a CMOS DRAM memory cell, as set forth in commonly-owned U.S. Pat. No. 5,162,248, issued Nov. 10, 1992 to Dennison et al., hereby incorporated herein by reference. It should be understood that the figures presented in conjunction with this description are not meant to be actual cross-sectional views of any particular portion of an actual semiconductor device, but are merely idealized representations which are employed to more clearly and fully depict the process than would otherwise be possible.

FIG. 8 illustrates an intermediate structure 300 in the production of a memory cell. This intermediate structure 300 comprises a semiconductor substrate 302, such as a lightly doped P-type crystal silicon substrate, which has been oxidized to form thick field oxide areas 304 and exposed to implantation processes to form drain regions 306 and source regions 308. Transistor gate members 310 are formed on the surface of the semiconductor substrate 302, including the gate members 310 residing on a substrate active area 312 spanned between the drain regions 306 and the source regions 308. The transistor gate members 310 each comprise a lower buffer layer 314, preferably silicon dioxide, separating a gate conducting layer or wordline 316 of the transistor gate member 310 from the semiconductor substrate 302. Transistor insulating spacer members 318, preferably silicon dioxide or silicon nitride, are formed on either side of each transistor gate member 310 and a cap insulator 320, also preferably silicon dioxide or silicon nitride, is formed on the top of each transistor gate member 310.

A first barrier layer 322, generally tetraethyl orthosilicate—TEOS, is disposed over the semiconductor substrate 302, the thick field oxide areas 304, and the transistor gate members 310. A second barrier layer 324 (generally made of borophosphosilicate glass—BPSG, phosphosilicate glass—PSG, or the like) is deposited over the first barrier layer 322.

As shown in FIG. 9, a resist material 326 is patterned on the second barrier layer 324, such that predetermined areas for subsequent memory cell capacitor formation will be etched. The second barrier layer 324 and the first barrier layer 322 are etched to form vias 328 to expose the drain regions 306 on the semiconductor substrate 302, as shown in FIG. 10. The resist material 326 is then removed, as shown in FIG. 11, and a conformal layer of first conductive material 330, generally a doped polysilicon, is then applied over second barrier layer 324, preferably by sputtering or chemical vapor deposition, as shown in FIG. 12. The first conductive material layer 330 makes contact with each drain region 306 of the semiconductor substrate 302.

As shown in FIG. 13, a thick layer of resist material 332 is deposited over the first conductive material 330. The thick resist material 332 should be sufficiently thick enough to fill the first conductive material 330 lined vias 328. The thick resist material 332 is removed down to the first conductive material 330 by CMP, as shown in FIG. 14.

As shown in FIG. 15, the upper portions (planar to the substrate) of the first conductive material 330 are removed, generally by wet etch or an optimized CMP etch, to separate neighboring first conductive material 330 structures, thereby forming individual cell containers 334 residing in the vias 328 and exposing the second barrier layer 324. It can be seen that the thick layer of resist material 332 protects the first conductor material 330 during the formation of the individual cell containers 334. The thick resist layer 332 is then removed, generally by an etch, which also removes a portion of the second barrier layer 324, as shown in FIG. 16.

A dielectric material layer 336 is deposited over the cell container 334 and the exposed areas of the second barrier layer 324, as shown in FIG. 17. A second conductive material layer 338 is then deposited over the dielectric material layer 336, as shown in FIG. 18, which serves as a capacitor cell plate common to an entire array of capacitors.

One processing problem in the use of CMP as a planarization technique to remove the thick resist material 332 down to the first conductive material 330, as shown in FIG. 14, stems from the hydrophobic nature of both the thick resist material 332 and the non-porous planarizing pads 204 (see FIGS. 6 and 7) used in the CMP process. Planarizing pads are usually composed of either a matrix of cast polyurethane foam with filler material to control hardness or polyurethane impregnated felts. Polyurethane is utilized because urethane chemistry allows the pad characteristics to be tailored to meet specific mechanical properties. Non-porous planarizing pads 204 are advantageous for planarization because they have good pad to pad repeatability (similar removal characteristics for similar pads) and uniformity of planarization. However, upon initial contact of the non-porous planarizing pad 204 and the thick resist material 332, the surfaces of each "de-wet", resulting in an initial stiction which can literally pop the semiconductor substrate 210 (see FIG. 7) from the rotatable substrate carrier 206. This may occur regardless of technique (i.e., mechanical affixation, vacuum affixation, friction affixation, and the like) used to retain the semiconductor substrate 210 on the rotatable planarizing platen 202. This may occur even when the rotatable substrate carrier 206 has a recess to receive the semiconductor substrate 210 because the force pulling the semiconductor substrate 210 toward the planarizing pad 204 is substantially greater than the force keeping the semiconductor substrate 210 in the recess of the rotatable substrate carrier 206. Furthermore, when the surfaces de-wet (assuming that the semiconductor substrate 210 does not pop out of the substrate carrier 206), no polishing occurs.

In order to overcome this problem, the present inventors have succeeded in using a two-step process, wherein the resist is first planarized with a porous planarizing pad, such as an IC-1000 pad from Rodel, Inc. of Newark, Del., which does not appear to suffer from this de-wetting to the same degree as non-porous pads. The planarizing is then completed with a non-porous pad, leaving the containers full of resist, but the bulk of the surface is hydrophillic due to the fact that the underlying layer is now exposed. However, utilizing a two-step process is time consuming and thus increases the cost of the semiconductor component.

Therefore, it would be desirable to develop a technique to reduce de-wetting between the planarizing pad and the semiconductor substrate using commercially-available, widely-practiced semiconductor device fabrication techniques without requiring additional processing steps.

SUMMARY OF THE INVENTION

The present invention relates to altering the surface of the resist material on a semiconductor substrate to be substantially hydrophillic in order to aid planarization. The surface of the resist material is oxidized to improve the wetting of the resist material surface. This oxidation may be achieved by oxygen plasma etching or ashing, immersing the semiconductor substrate in a bath containing an oxidizing agent, or adding an oxidizing agent to the chemical slurry used during planarization of the resist material. The present invention may be used in the fabrication of capacitors for DRAMs as discussed above for U.S. Pat. No. 5,162,248. Oxidation of the resist material will prevent stiction between a plananizing pad and the thick photoresist layer (used to protect the conductor material used in the formation of individual cell containers, as discussed above) when a CMP process is utilized.

Oxidation of the resist material may be achieved through a low pressure plasma technique, such as a partial dry etch (such as plasma etching) or an ashing technique (such as barrel ash) technique. In plasma etching, a glow discharge is used to produce reactive species, such as atoms, radicals, and/or ions, from relatively inert gas molecules. Essentially, a plasma etching process comprises the following: 1) reactive species are generated in a plasma from a bulk gas, 2) the reactive species diffuse to a surface of a material being etched, 3) the reactive species are absorbed on the surface of the material being etched, 4) a chemical reaction occurs which results in the formation of a volatile by-product, 5) the by-product is desorbed from the surface of the material being etched, and 6) the desorbed by-product diffuses into the bulk gas. The materials used for photoresist are generally organic polymers, such as phenol-formaldehyde, polyisoprene, poly-methyl methacrylate, poly-methyl isopropenyl ketone, poly-butene-1-sulfone, poly-trifluoroethyl chloroacrylate, and the like. Such photoresist materials are generally etched in plasmas containing pure oxygen at moderate pressures to produce reactive species that attack the organic materials to form $CO$, $CO_2$, and $H_2O$ as volatile by-products. Ashing is an etching technique which is very similar to plasma etching with the exception that, rather than a volatile by-product being produced and desorbed, an ash residue is produced.

The present invention contemplates arresting the plasma etching or ashing process prior to complete desorption of the by-product into the bulk gas or the complete decomposition of the material to be etched into a residue, respectively. This is believed to result in oxygen radicals/dangling bonds (for a limited time up to about 24 hours) on the surface of the photoresist which improves the wetting of the surface (i.e., makes the resist material surface more hydrophillic). Thus, when the semiconductor wafer contacts a planarizing pad, the resist material on the surface of the semiconductor will not "de-wet". Thus, the semiconductor substrate will not become dislodged from its rotatable substrate carrier.

The present invention also contemplates utilizing a dry etch process (complete, timed or endpoint) to near completion for the removal of the resist material and finishing the removal of resist material using either a hydrophillic pad or a porous hydrophobic pad in a CMP process to complete the photoresist material removal process and planarize the substrate.

The present invention further contemplates using an oxidizing treatment prior to the CMP process, such as an oxidizing bath or dip (e.g., photo piranha), and yet further contemplates including a strong oxidant in the slurry of the CMP process for either the initial part or whole duration of the CMP process.

An additional benefit of either the oxygen plasma ash (where the wafers stand substantially upright, such as in a quartz cassette) or oxidizing bath is the oxidation of the backside of the semiconductor wafer, which is typically polysilicon for semiconductor wafers used for making DRAM chips. The oxidation of the backside of the semiconductor wafer aids in retaining the semiconductor wafer on the rotatable substrate carrier by allowing for better wetting between the carrier and the backside of the semiconductor wafer. The wetting between the carrier and the backside of the semiconductor wafer results in better adhesion due to surface tension.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
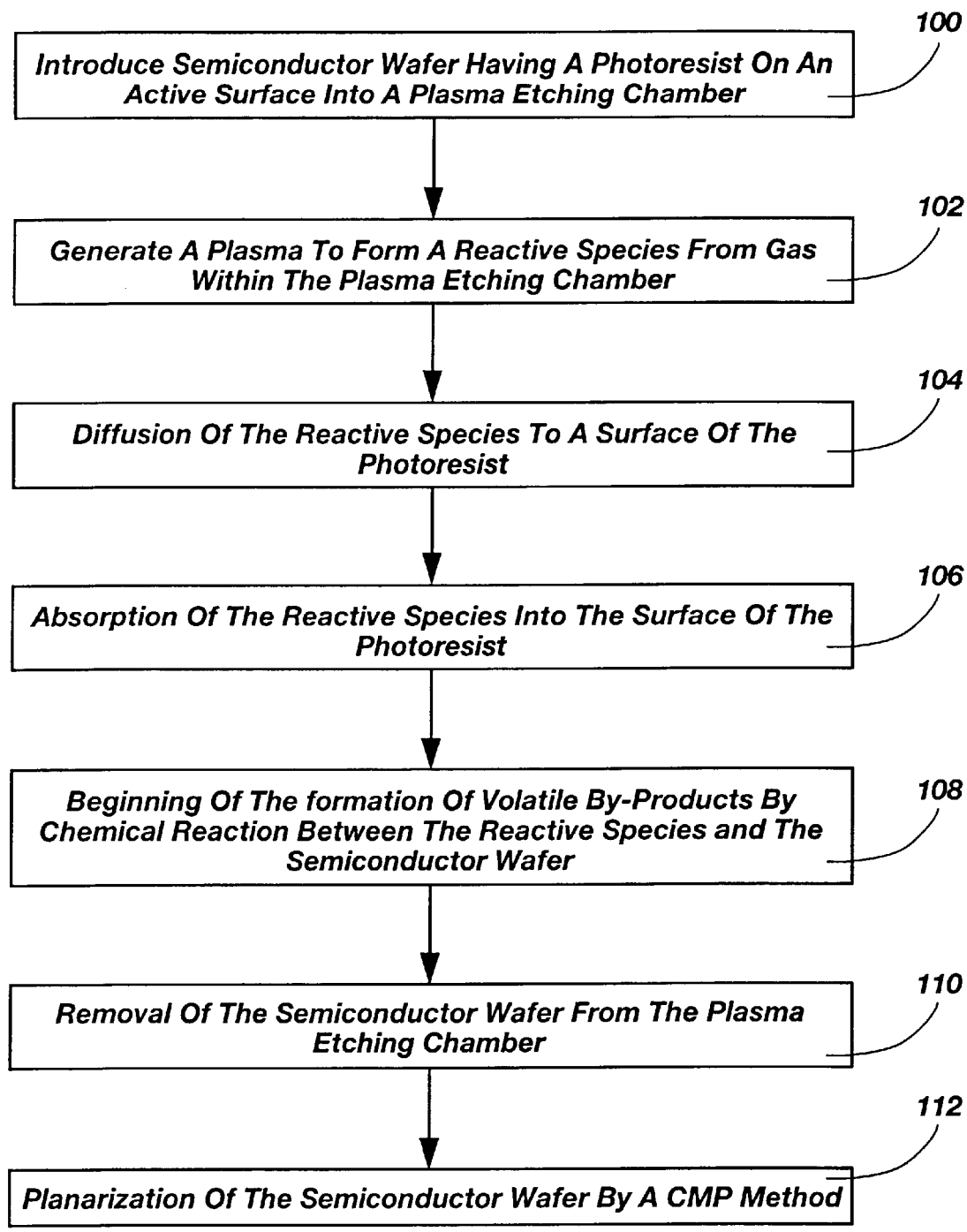
FIG. 1 is a flow diagram of an oxygen plasma etch method of the present invention.

FIG. 1 illustrates a flow diagram of an oxygen plasma etch method of the present invention wherein a semiconductor substrate, such as a semiconductor wafer, having a photoresist material on an active surface thereof is introduced into a plasma etching chamber, as stated in step 100. In step 102, a plasma is generated in an oxygen gas atmosphere to form at least one reactive species (i.e., radicals and/or ions) from the oxygen gas, preferably operated at between about 500 and 1000 watts. The reactive species diffuses to the surface of the photoresist material, as stated in step 104, where the reactive species is absorbed on the surface of the photoresist material, as stated in step 106. In step 108, a chemical reaction occurs, resulting in the beginning of the formation of volatile by-products. The semiconductor wafer is removed, as stated in step 110, and the photoresist material planarized by a CMP method, as stated in step 112. The duration of the plasma etch is determined by the desired depth of reaction into the semiconductor wafer.

Figure 2:
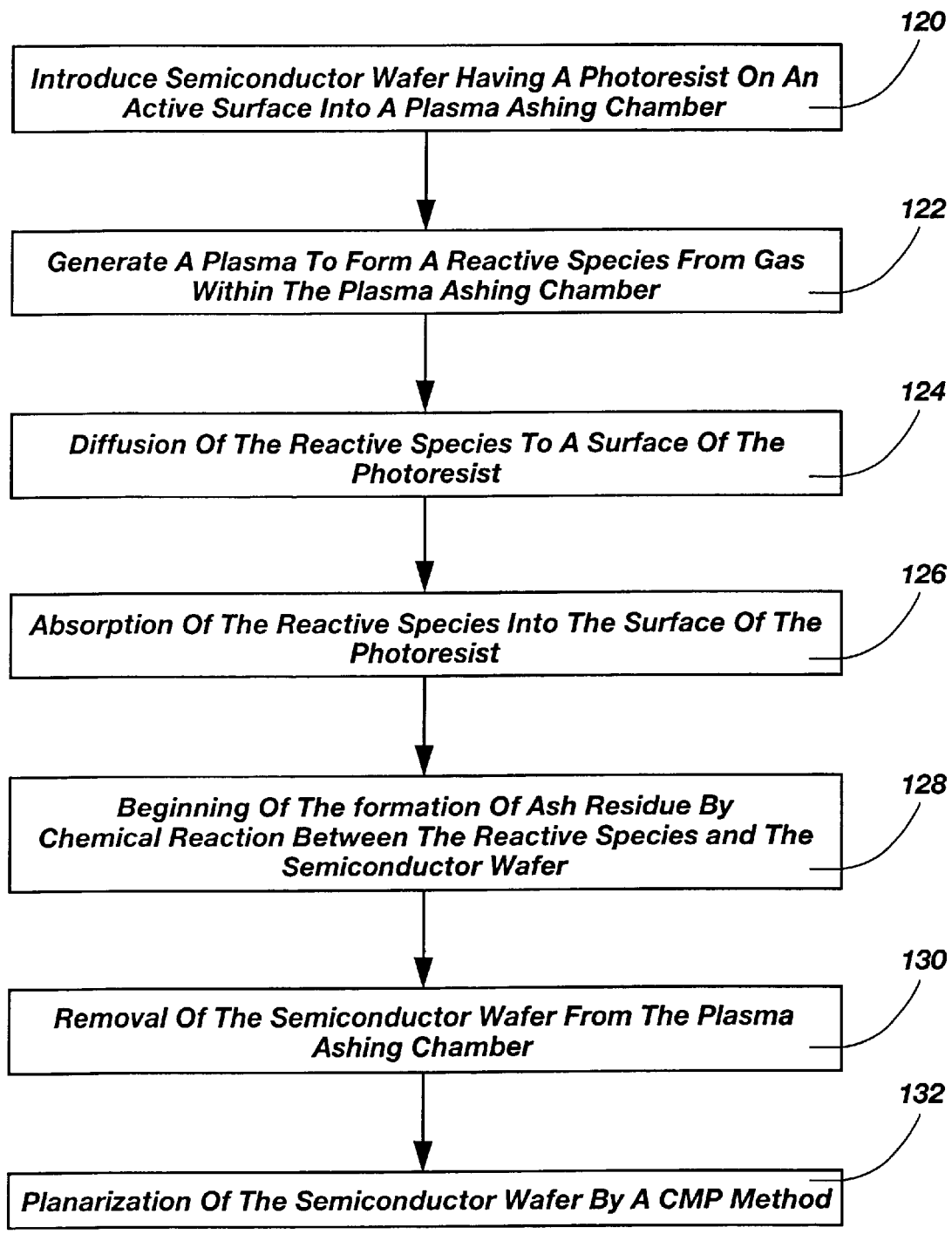
FIG. 2 is a flow diagram of an oxygen plasma ash method of the present invention.

FIG. 2 illustrates a flow diagram of an oxygen plasma ash method of the present invention wherein a semiconductor wafer having a photoresist on an active surface thereof is introduced into a plasma ashing chamber, as stated in step 120. In step 122, a plasma is generated in an oxygen gas atmosphere at between about 500 to 1000 watts to form reactive species (i.e., radicals and/or ions) from the oxygen gas for between about 5 to 45 minutes depending on the characteristics of the photoresist material. The reactive species diffuses to the surface of the photoresist material, as stated in step 124, where the reactive species is absorbed on the surface of the photoresist material, as stated in step 126. In step 128, a chemical reaction occurs, resulting in the beginning of the formation of residue ash. The semiconductor wafer is removed, as stated in step 130, and the photoresist material is planarized by a CMP method, as stated in step 132.

Figure 3:
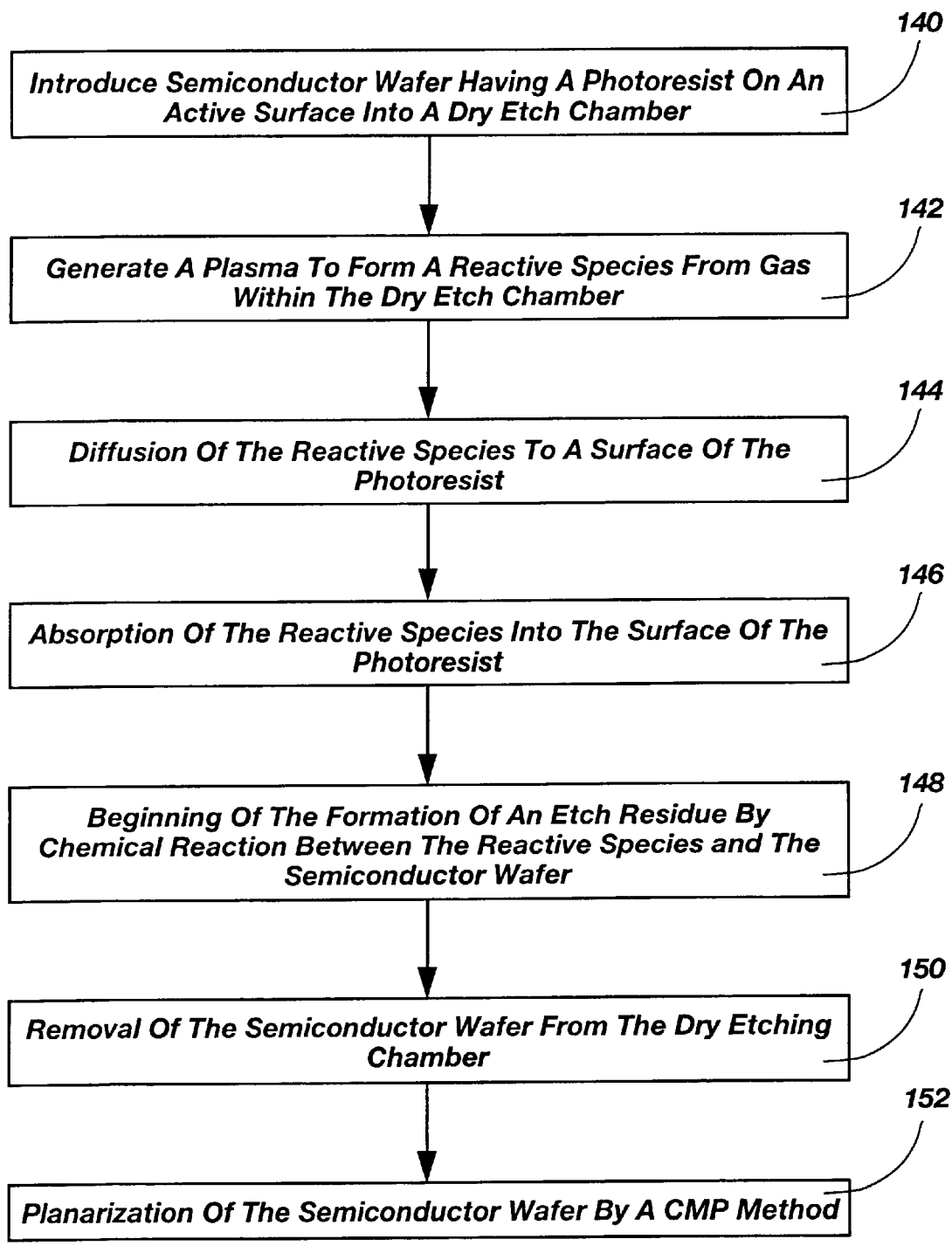
FIG. 3 is a flow diagram of a near completion dry etch process of the present invention.

FIG. 3 illustrates a flow diagram of an near completion dry etch process of the present invention wherein a semiconductor wafer having a photoresist on an active surface thereof is introduced into a dry etching chamber, as stated in step 140. In step 142, a plasma is generated in an oxygen gas atmosphere at between about 500 to 1000 watts to form reactive species (i.e., radicals and/or ions) from the oxygen gas for between about 1 to 30 minutes depending on the characteristics of the photoresist material. The reactive species diffuses to the surface of the photoresist material, as stated in step 144, where the reactive species is absorbed on the surface of the photoresist material, as stated in step 146. In step 148, a chemical reaction occurs, resulting in the beginning of the formation of an etch residue. The semiconductor wafer is removed, as stated in step 150, and the photoresist material is planarized by a CMP method, as stated in step 152.

Figure 4:
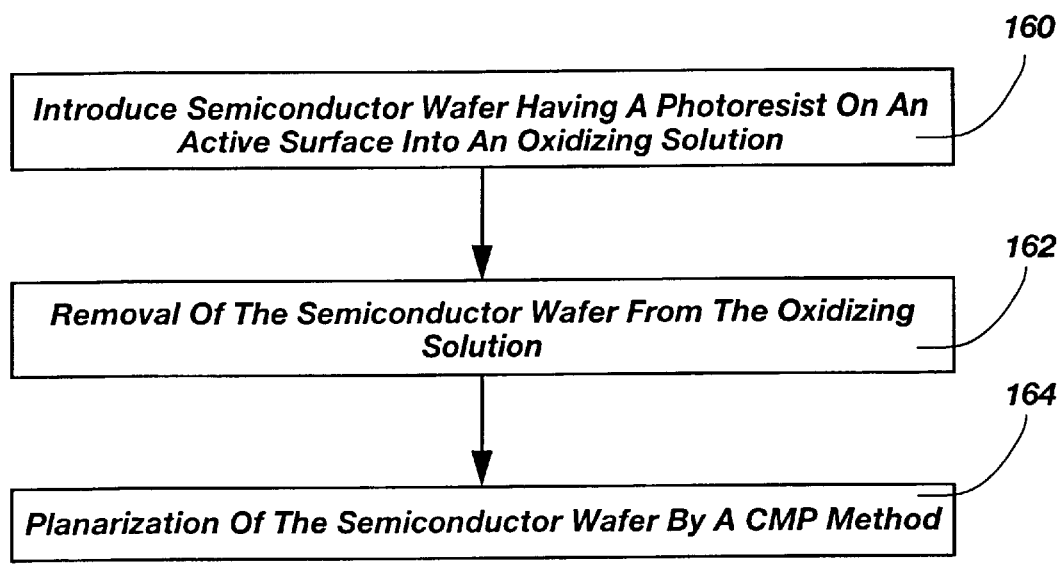
FIG. 4 is a flow diagram of an oxidizing bath method of the present invention.

FIG. 4 illustrates a flow diagram of an oxidizing bath method of the present invention wherein a semiconductor wafer having a photoresist material on at least one surface thereof is introduced into an oxidizing solution, as stated in step 160, such as a sulfuric acid/peroxide solution. The concentration of the oxidizing solution and the duration of the semiconductor wafer in the oxidizing solution is dependent on the type of photoresist material used, the desired depth of oxidation, and the uniformity of oxidation required. For example, in a dilute solution it may take as long as 45 minutes to achieve the desired depth of oxidation. In a concentrated solution, it may only take 5 minutes to achieve the desired depth of oxidation, but the oxidation will be less uniform across the wafer. After oxidizing, the semiconductor wafer is removed from the oxidizing solution, as stated in step 162, and the photoresist material is planarized by a CMP method, as stated in step 164.

An oxidizing slurry method of the present invention comprises adding an oxidant to the chemical slurry of the CMP process for either the initial part or whole duration of the CMP process. Referring back to prior art FIGS. 6 and 7, a chemical slurry 220 (shown in FIG. 6) is supplied through a conduit 222 which dispenses the chemical slurry 220 onto the planarizing pad 204. The chemical slurry 220 contains a planarizing agent, such as alumina, silica, or fumed silica carried in an ammonium hydroxide solution or the like, which is used as the abrasive material for planarization. The present invention adds an oxidant to the chemical slurry 220 for either the initial part or whole duration of the CMP process. The oxidant is preferably hydrogen peroxide, potassium iodate, ferric nitrate, or the like, and constitutes between about 1% and 15% by volume of the chemical slurry. Adding the oxidant to the chemical slurry 220 will continuously oxidize the photoresist material during the time the oxidant is added. This will continually refresh the photoresist material surface with oxygen radicals/dangling bonds, thereby continuously wetting the photoresist material during the CMP process while the oxidant is being added.

Figure 5:
FIG. 5 is a cross-sectional view of an abrasive impregnated planarizing pad of the present invention.

The CMP process may also be effected using an abrasive impregnated planarizing pad. As shown in cross-sectional view in FIG. 5, the planarizing pad 170 comprises an abrasive material 172, such as cerium oxide or silica, distributed throughout a cast resin matrix 174. Such an abrasive impregnated planarizing pad 170 is advantageous in that it is used without a chemical slurry and, thus, not subject to slurry transport which can lead to a non-uniform planarization. Further, such an abrasive impregnated planarizing pad 170 also requires no conditioning (i.e., scratching) of its planarizing surface prior to use.

Having thus described in detail preferred embodiments of the present invention, it is to be understood that the invention defmed by the appended claims is not to be limited by particular details set forth in the above description as many apparent variations thereof are possible without departing from the spirit or scope thereof.

What is claimed is:

1. A method of planarizing an oxidizable material layer on a semiconductor substrate, comprising:

providing a semiconductor substrate having thereon an oxidizable material layer of a depth;

oxidizing an exposed surface portion of said oxidizable material layer in a first environment to a depth less than the depth of the oxidizable material layer; and planarizing said exposed oxidized surface portion of said oxidizable material layer in a second, differing environment so as to subtantially remove said depth of said oxidized exposed surface of said oxidizable material layer.

2. The method of claim 1, wherein said oxidizing said exposed surface of said oxidizable material layer comprises:

introducing said semiconductor substrate into a plasma etching chamber; and generating a plasma within said plasma etching chamber in an atmosphere containing oxygen to form at least one reactive species which oxidizes said exposed surface of said oxidizable material layer.

3. The method of claim 1, wherein said oxidizing said exposed surface of said oxidizable material layer comprises:

introducing said semiconductor substrate into a plasma ashing chamber; and generating a plasma within said plasma ashing chamber in an atmosphere containing oxygen to form at least one reactive species which oxidizes said exposed surface of said oxidizable material layer.

4. The method of claim 1, wherein said oxidizing said exposed surface of said oxidizable material layer comprises immersing said semiconductor substrate into an oxidizing solution.

5. The method of claim 4, wherein said oxidizing solution comprises a sulfuric acid and peroxide solution.

6. The method of claim 1, wherein said oxidizable material layer is an organic film.

7. The method of claim 6, wherein said organic film is a photoresist material.

8. The method of claim 1, wherein said planarizing comprises abrasion.

9. The method of claim 8, wherein said abrasion comprises chemical mechanical planarization.

10. The method of claim 9, wherein said chemical mechanical planarization is effected with a non-porous planarization pad.

11. The method of claim 9, wherein said chemical mechanical planarization is effected with a planarization pad having abrasives disposed therein.

12. A method of planarizing a semiconductor substrate coated with an organic film resist comprising:

oxidizing an exposed surface of said organic film resist; and planarizing said semiconductor substrate by a chemical mechanical planarization technique.

13. The method of claim 12, wherein said oxidizing said exposed surface of said organic film resist comprises:

introducing said semiconductor substrate into a plasma etching chamber; and generating a plasma within said plasma etching chamber in an atmosphere containing oxygen to form at least one reactive species which oxidizes said exposed surface of said organic film resist.

14. The method of claim 12, wherein said oxidizing said exposed surface of said organic film resist comprises:

introducing said semiconductor substrate into a plasma ashing chamber; and generating a plasma within said plasma ashing chamber in an atmosphere containing oxygen to form at least one reactive species which oxidizes said exposed surface of said organic film resist.

15. The method of claim 12, wherein said oxidizing said exposed surface of said organic film resist comprises immersing said semiconductor substrate into an oxidizing solution.

16. The method of claim 15, wherein said oxidizing solution comprises a sulfuric acid and peroxide solution.

17. The method of claim 12, wherein said oxidizing said exposed surface of said organic film resist comprises:

introducing an oxidizing agent to a planarization slurry to form an oxidizing slurry; and dispensing said oxidizing slurry onto said exposed surface of said organic film resist during said planarizing of said semiconductor substrate.

18. The method of claim 17, wherein said introducing said oxidizing agent occurs during an initial part of said planarizing of said semiconductor substrate.

19. The method of claim 17, wherein said oxidizing agent comprises between about 1% and 15% by volume of said planarization slurry.

20. The method of claim 17, wherein said oxidizing agent is an oxidant selected from the group consisting of hydrogen peroxide, potassium iodate, and ferric nitrate.

21. The method of claim 12, wherein said organic film resist is a photoresist material.

22. The method of claim 12, wherein said planarizing comprises chemical mechanical planarization.

23. The method of claim 22, wherein said chemical mechanical planarization is effected with a non-porous planarization pad.

24. The method of claim 22, wherein said chemical mechanical planarization is effected with a planarization pad having abrasives disposed therein.

25. A method of planarizing a semiconductor substrate coated with an organic film resist comprising:

oxidizing an exposed surface of said organic film resist;

mounting said semiconductor substrate in a rotatable substrate carrier;

contacting said semiconductor substrate with a chemical mechanical planarization pad; and rotating said substrate carrier to planarize said semiconductor substrate.

26. The method of claim 25 further including rotating said chemical mechanical planarization pad.

27. The method of claim 25, wherein said oxidizing said exposed surface of said organic film resist comprises:

introducing said semiconductor substrate into a plasma chamber; and generating a plasma within said plasma chamber in an atmosphere containing oxygen to form at least one reactive species which oxidizes said exposed surface of said organic film resist.

28. The method of claim 25, wherein said oxidizing said exposed surface of said organic film resist comprises immersing said semiconductor substrate into an oxidizing solution.

29. The method of claim 28, wherein said oxidizing solution comprises a sulfuric acid and peroxide solution.

30. The method of claim 25, wherein said oxidizing said exposed surface of said organic film resist comprises:

introducing an oxidizing agent to a planarization slurry to form an oxidizing slurry; and dispensing oxidizing slurry onto said exposed surface of said organic film resist during said planarizing of said exposed surface of said organic film resist.

31. The method of claim 30, wherein said introducing said oxidizing agent occurs during an initial part of said planarizing of said exposed surface of said organic film resist.

32. The method of claim 30, wherein said oxidizing agent comprises between about 1% and 15% by volume of said planarization slurry.

33. The method of claim 30, wherein said oxidizing agent is an oxidant selected from the group consisting of hydrogen peroxide, potassium iodate, and ferric nitrate.

34. The method of claim 25, wherein said organic film resist is a photoresist material.

35. The method of claim 25, wherein said chemical mechanical planarization pad comprises a non-porous material.

36. The method of claim 25, wherein said chemical mechanical planarization pad includes abrasives disposed therein.

37. The method of claim 6, wherein said organic film is a resist material.

38. A method of planarizing an oxidizable material layer on a semiconductor substrate, comprising:

providing a semiconductor substrate having thereon an oxidizable material layer of a depth;

oxidizing an exposed surface portion of said oxidizable material layer to a depth less than the depth of the oxidizable material layer;

discontinuing said oxidizing an exposed surface portion of said oxidizable material once said depth of less than the depth of the oxidizable material layer has been reached; and planarizing said oxidized exposed surface portion of said oxidizable material layer so as to substantially remove said oxidized exposed surface portion.

39. The method of claim 38, wherein said oxidizing said exposed surface portion of said oxidizable material layer comprises:

introducing said semiconductor substrate into a plasma etching chamber; and generating a plasma within said plasma etching chamber in an atmosphere containing oxygen to form at least one reactive species which oxidizes said exposed surface of said oxidizable material layer.

40. The method of claim 38, wherein said oxidizing said exposed surface portion of said oxidizable material layer comprises:

introducing said semiconductor substrate into a plasma ashing chamber; and generating a plasma within said plasma ashing chamber in an atmosphere containing oxygen to form at least one reactive species which oxidizes said exposed surface of said oxidizable material layer.

41. The method of claim 38, wherein said oxidizing said exposed surface portion of said oxidizable material layer comprises immersing said semiconductor substrate into an oxidizing solution.

42. The method of claim 38, wherein said oxidizable material layer is an organic film.

* * * * *

UNITED STATES PATENT AND TRADEMARK OFFICE
CERTIFICATE OF CORRECTION

Figure 6:
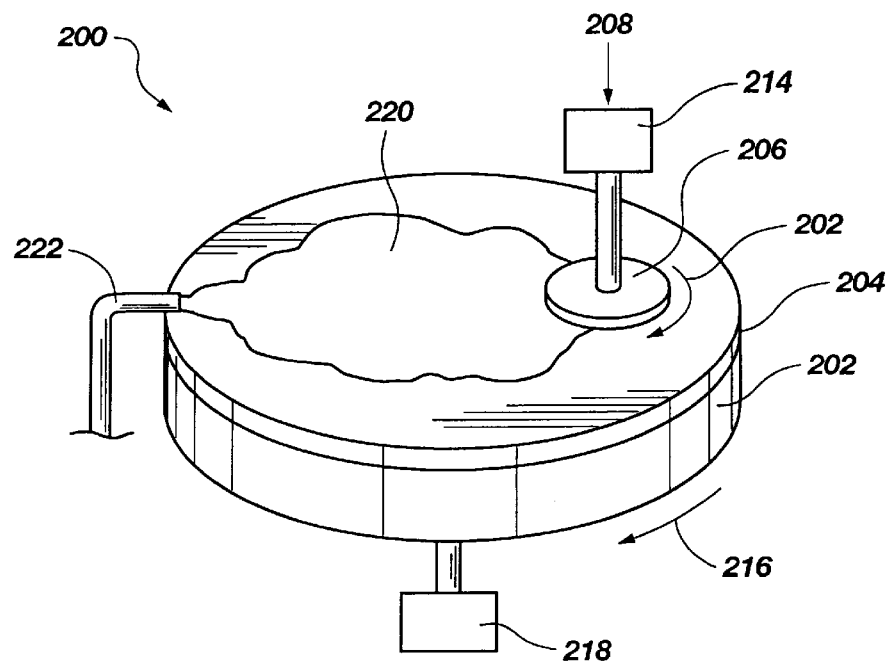
FIG. 6 is an oblique view of an exemplary CMP apparatus.
Figure 7:
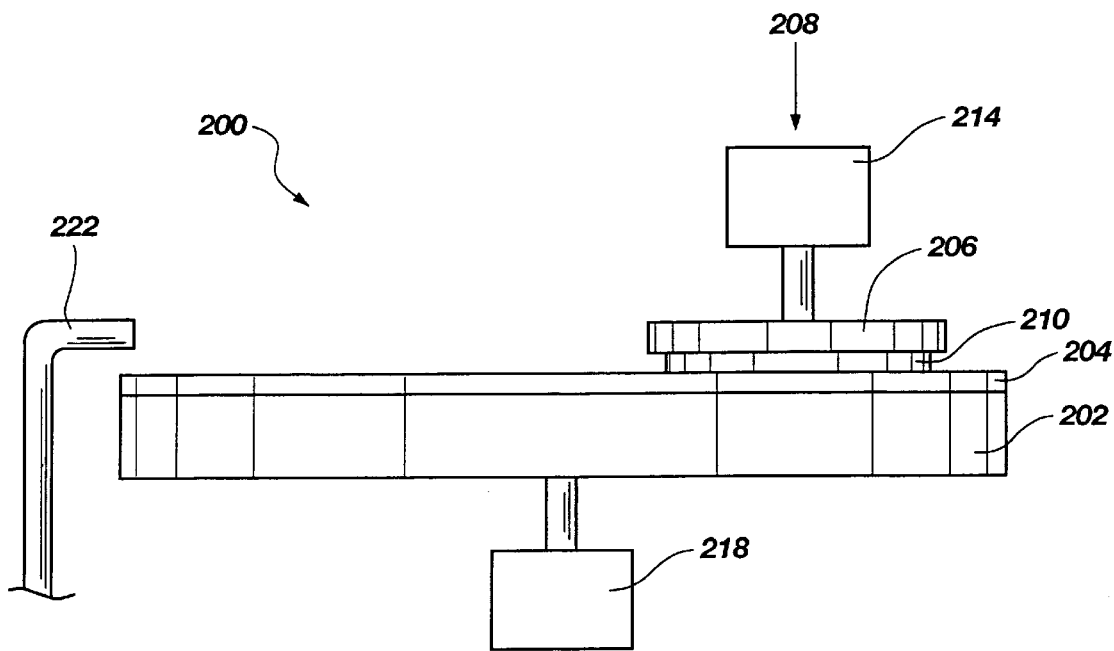
FIG. 7 is a side plan view of the CMP apparatus of FIG. 6.
Figure 8:
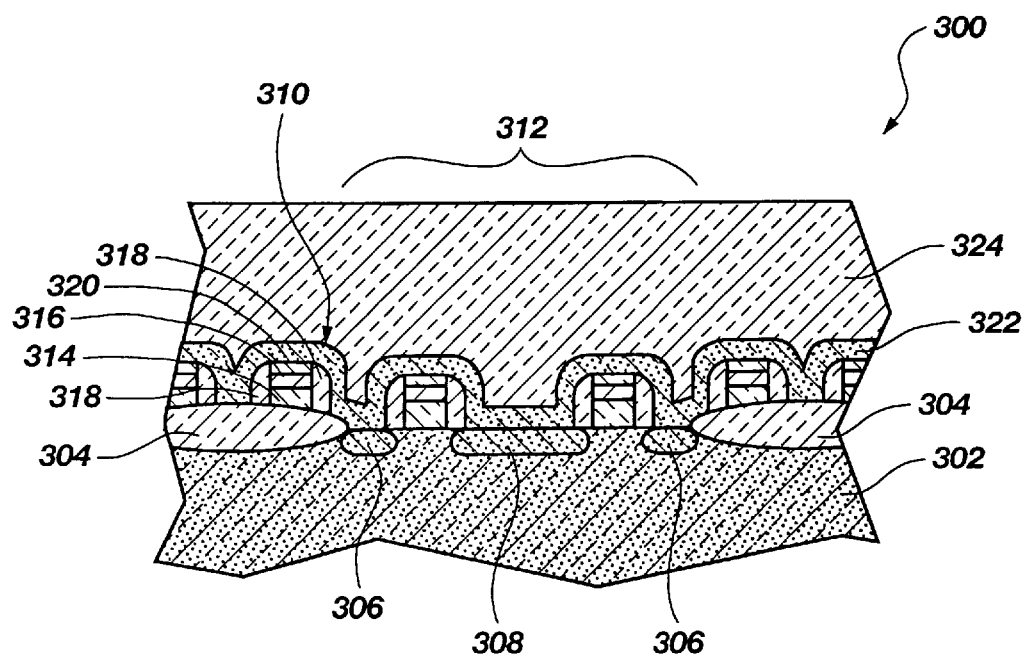
FIGS. 8–18 are side cross-sectional views of an exemplary technique of forming a capacitor for a memory cell.
Figure 9:
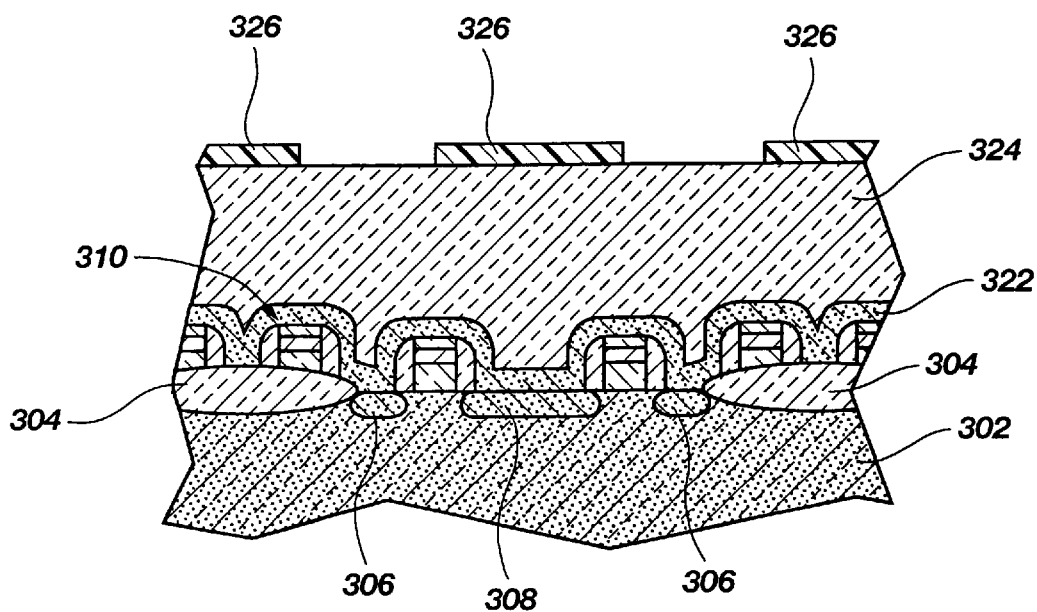
Figure 10:
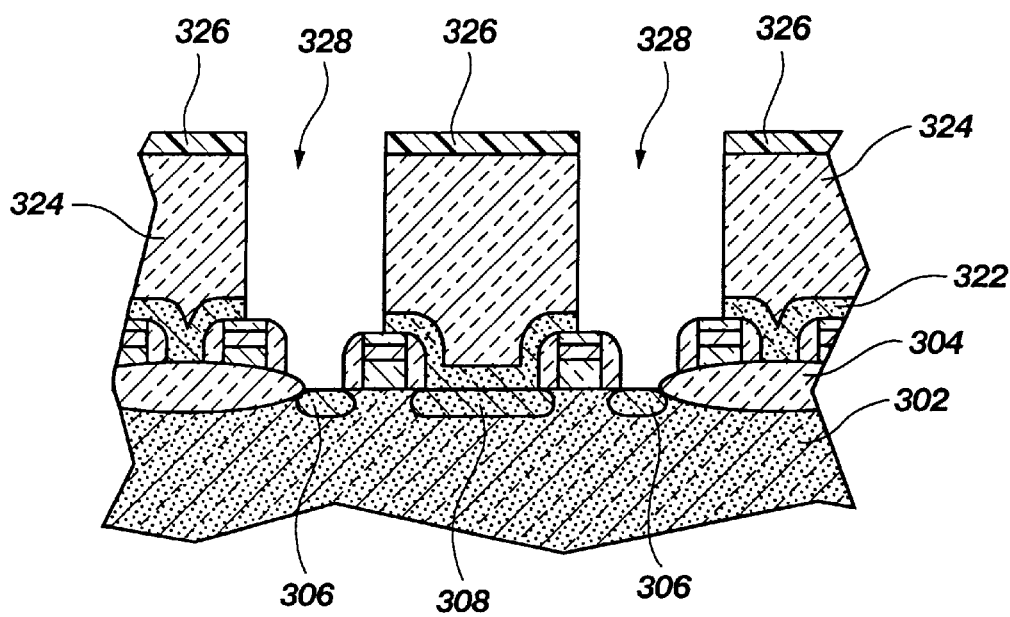
Figure 11:
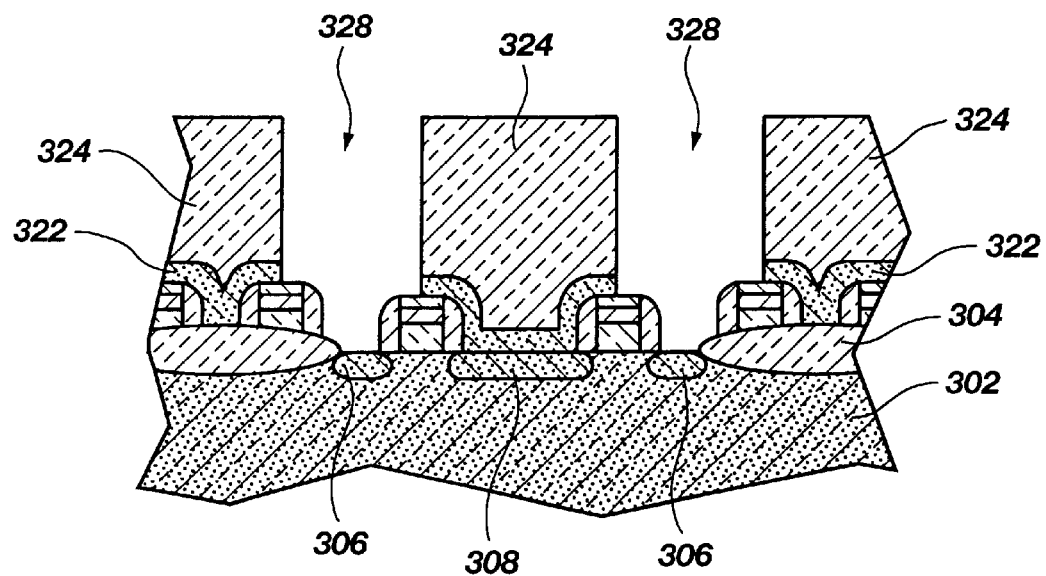
Figure 12:
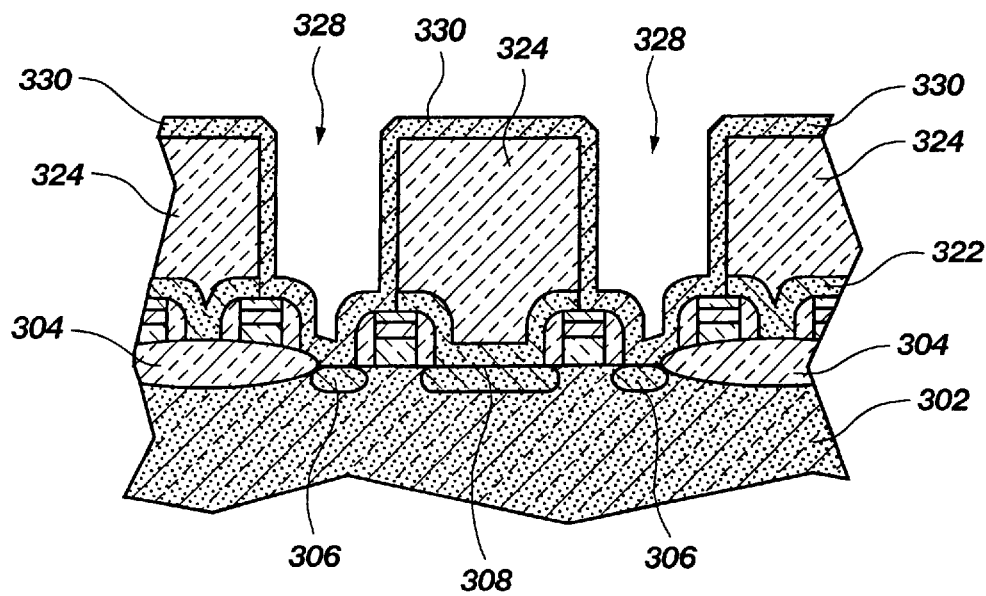
Figure 13:
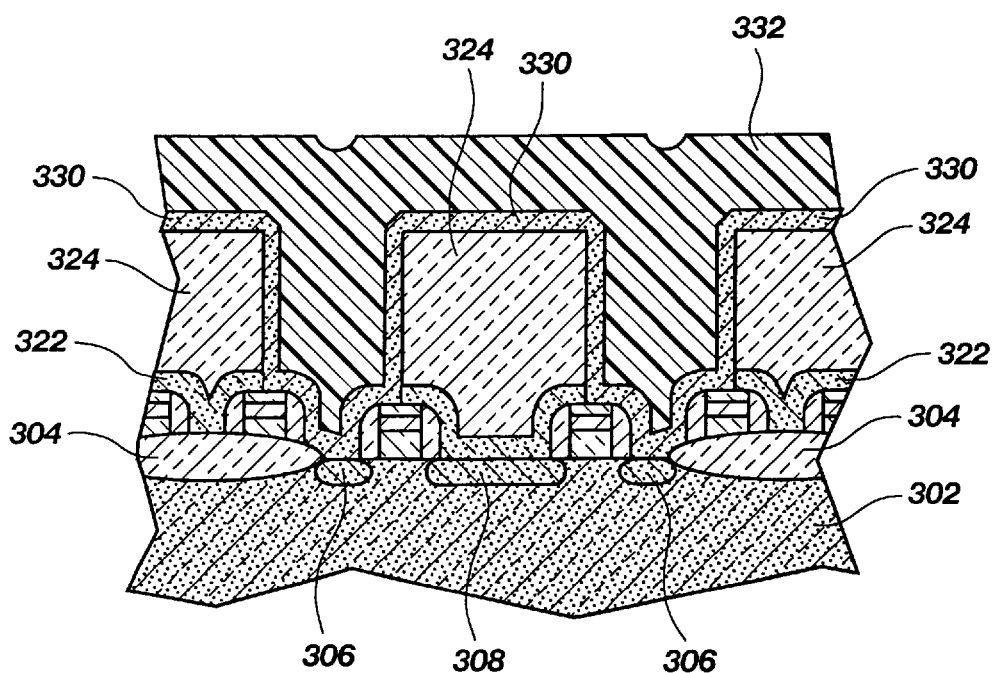
Figure 14:
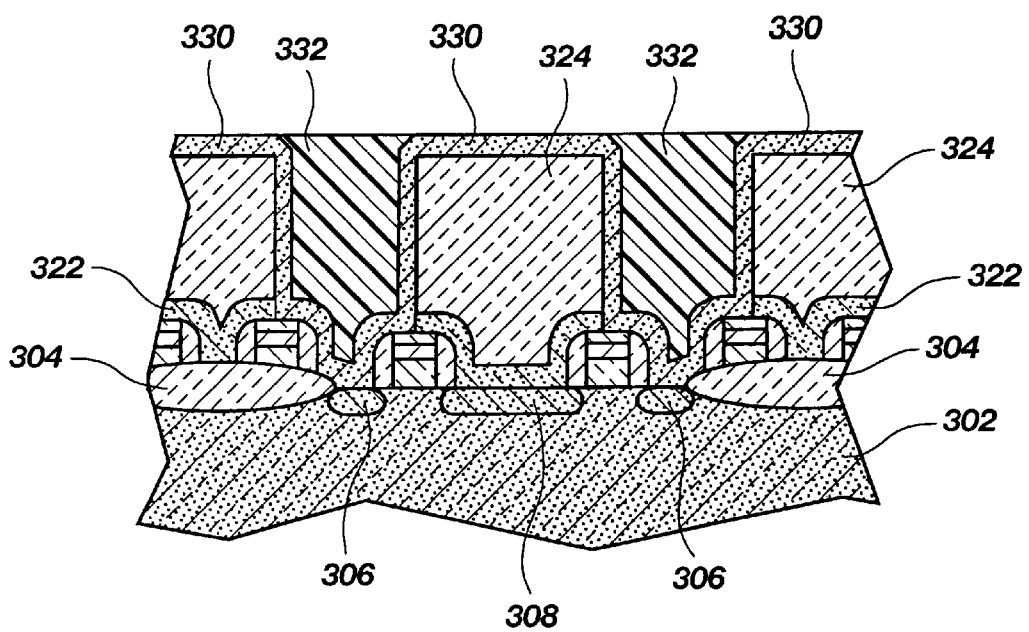
Figure 15:
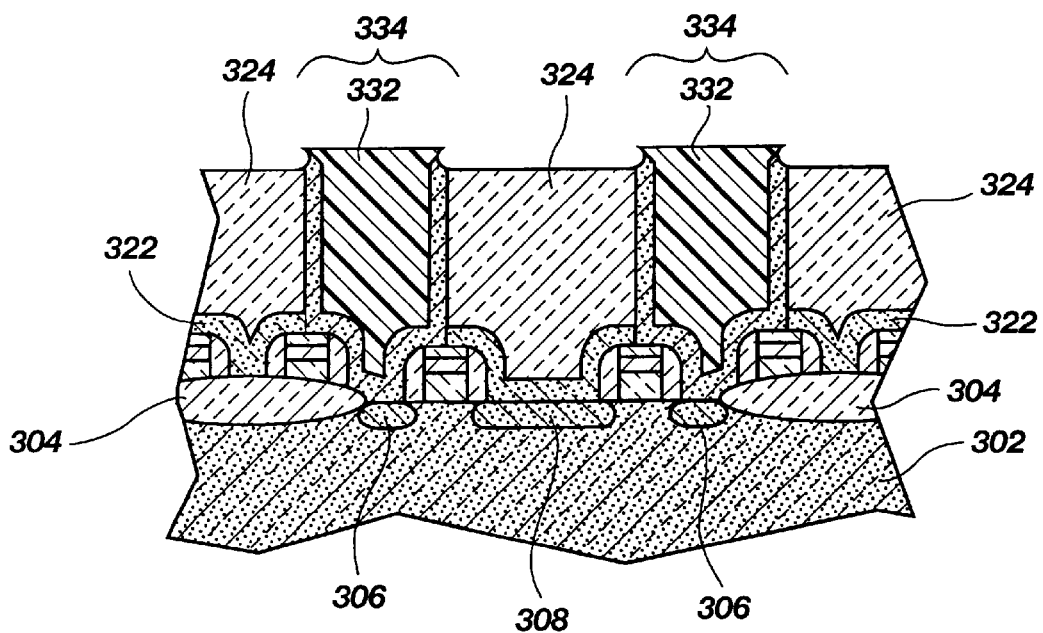
Figure 16:
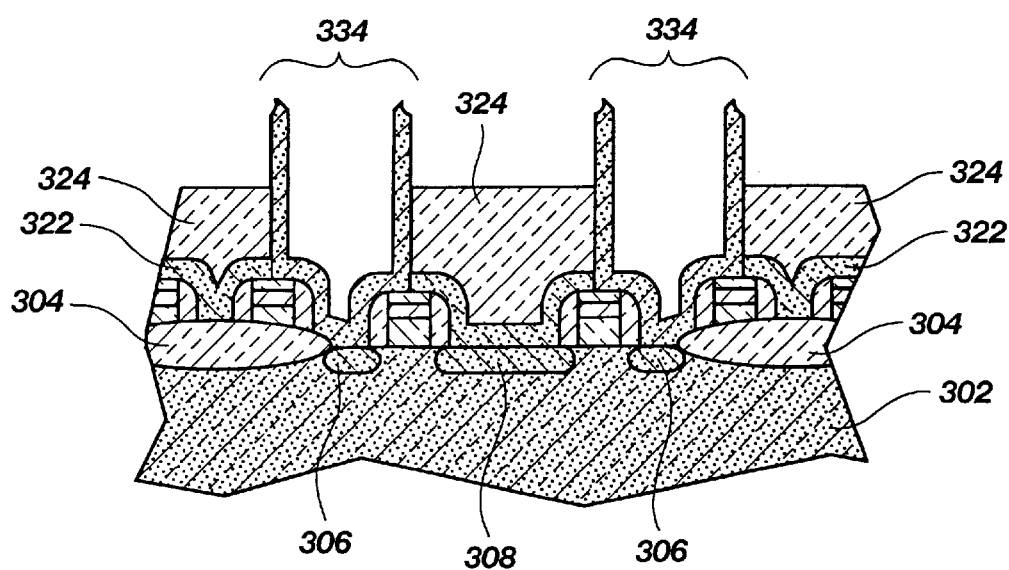
Figure 17:
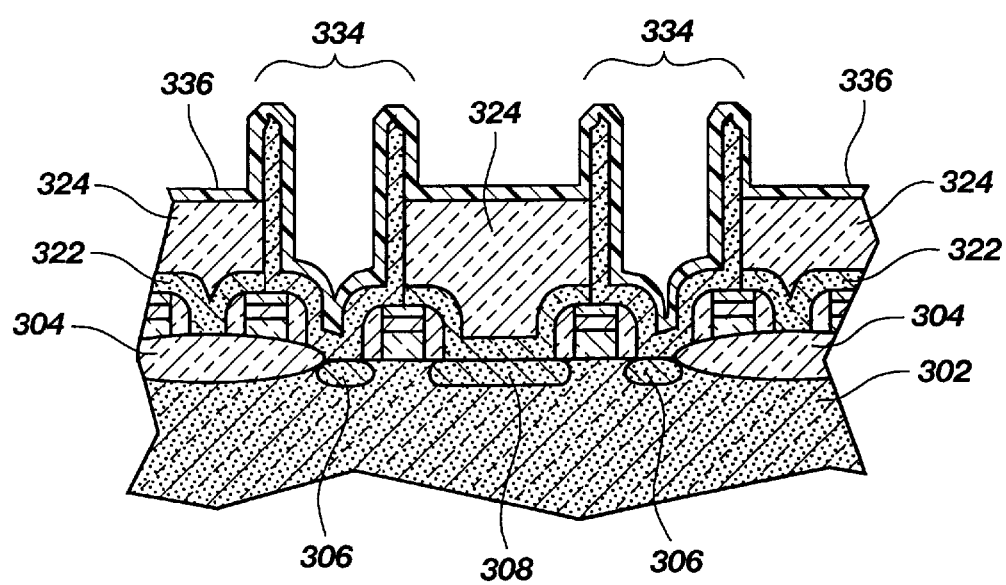
Figure 18:
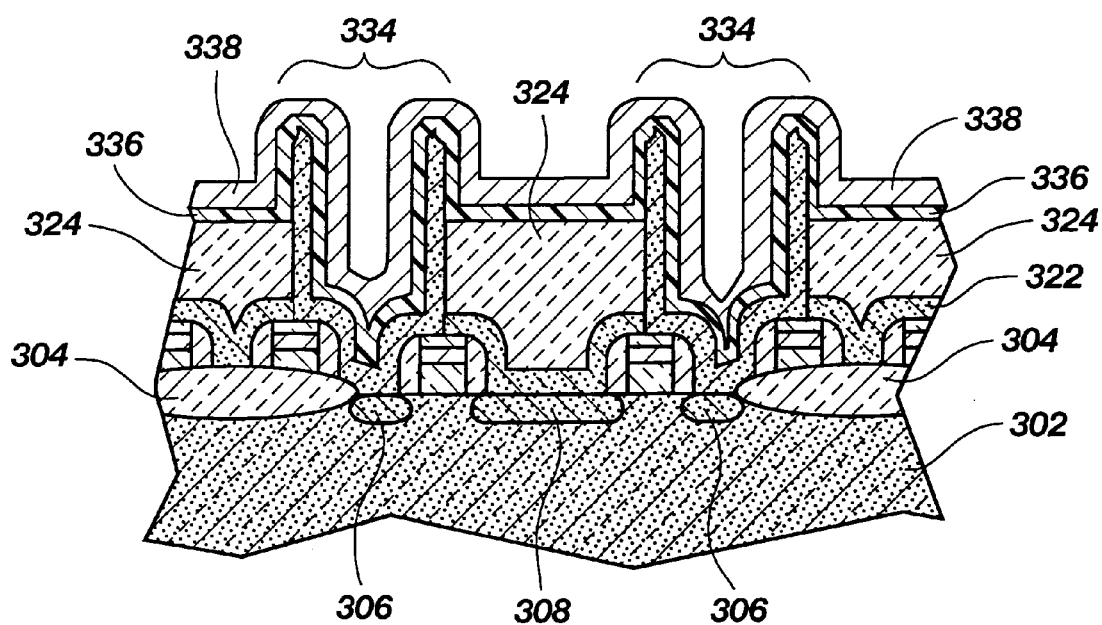

PATENT NO. : 6,200,901 B1
DATED : March 13, 2001
INVENTOR(S) : Guy F. Hudson and Michael A. Walker It is certified that error appears in the above-identified patent and that said Letters Patent is hereby corrected as shown below:

Drawings,
FIG. 6, change the reference numeral "202" that is indicating the direction arrow to -- 212 --.
Replace FIG. 6 with the following:
--                                                                                     --

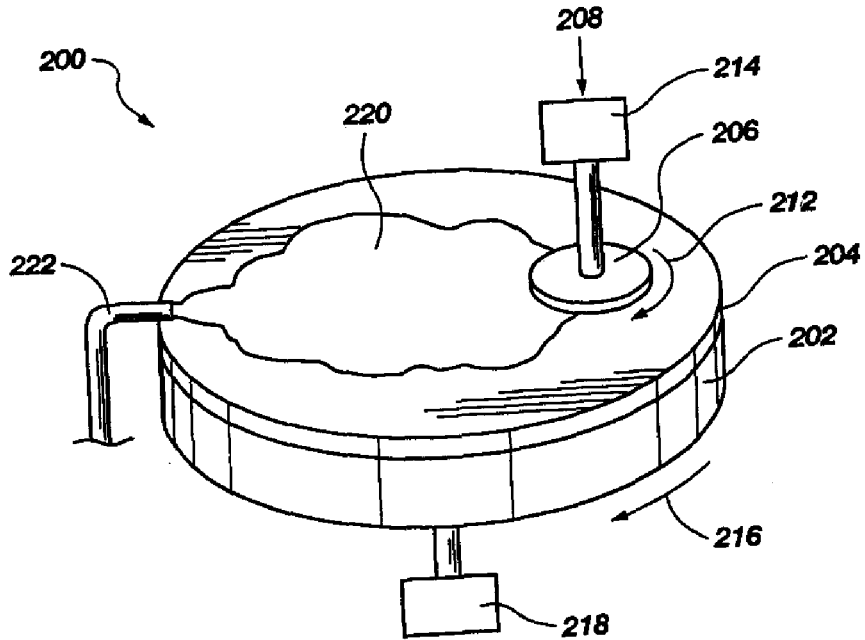

Fig. 6

Column 1,
Line 9, after "relates" and before "a" insert -- to --
Line 15, change "intergrated" to -- integrated --

Column 3,
Line 2, before "material" change "conductor" to -- conductive --

UNITED STATES PATENT AND TRADEMARK OFFICE
CERTIFICATE OF CORRECTION

PATENT NO.   : 6,200,901 B1
DATED        : March 13, 2001
INVENTOR(S)  : Guy F. Hudson and Michael A. Walker It is certified that error appears in the above-identified patent and that said Letters Patent is hereby corrected as shown below:

Column 7,
Line 6, change "defmed" to -- defined --

Signed and Sealed this

Fifteenth Day of March, 2005

JON W. DUDAS
*Director of the United States Patent and Trademark Office*